United States Patent
Yim et al.

(10) Patent No.: US 8,952,513 B2
(45) Date of Patent: Feb. 10, 2015

(54) STACK TYPE SEMICONDUCTOR PACKAGE AND METHOD OF FABRICATING THE SAME

(75) Inventors: Choong-bin Yim, Cheonan-si (KR); Dae-Young Choi, Yeosu-si (KR); Mi-Yeon Kim, Yongin-si (KR); Ji-yong Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 41 days.

(21) Appl. No.: 13/279,545

(22) Filed: Oct. 24, 2011

(65) Prior Publication Data
US 2012/0168917 A1    Jul. 5, 2012

(30) Foreign Application Priority Data
Dec. 31, 2010 (KR) .......................... 10-2010-014674

(51) Int. Cl.
*H01L 23/48* (2006.01)
*H01L 23/52* (2006.01)
(Continued)

(52) U.S. Cl.
CPC ........ *H01L 23/49816* (2013.01); *H01L 23/481* (2013.01); *H01L 24/24* (2013.01); *H01L 25/105* (2013.01); *H01L 23/3128* (2013.01); *H01L 23/49833* (2013.01); *H01L 23/5389* (2013.01); *H01L 24/82* (2013.01); *H01L 2224/16227* (2013.01); *H01L 2224/2402* (2013.01); *H01L 2224/24051* (2013.01); *H01L 2224/24105* (2013.01); *H01L 2224/24226* (2013.01); *H01L 2224/245* (2013.01); *H01L 2224/48227* (2013.01); *H01L 2224/73259* (2013.01); *H01L 2224/73265* (2013.01); *H01L 2224/82* (2013.01); *H01L 2224/82105* (2013.01); *H01L 2924/01029* (2013.01); *H01L 2924/01082* (2013.01); *H01L 24/48* (2013.01); *H01L 2225/0651* (2013.01);
(Continued)

(58) Field of Classification Search
CPC ........... H01L 2224/73265; H01L 2924/15311; H01L 2224/73204; H01L 224/32145; H01L 2224/16145; H01L 24/17
USPC .......................... 257/686, 777, 778, 723, 724
See application file for complete search history.

(56) References Cited

U.S. PATENT DOCUMENTS

2002/0180041 A1* 12/2002 Sahara et al. .................. 257/738
2004/0178499 A1*  9/2004 Mistry et al. .................. 257/734
(Continued)

FOREIGN PATENT DOCUMENTS

JP    2009-94434 A    4/2009
JP    2010-407721 A   2/2010

*Primary Examiner* — S. V. Clark
(74) *Attorney, Agent, or Firm* — Sughrue Mion, PLLC

(57) ABSTRACT

A stack type semiconductor package and a method of fabricating the stack type semiconductor package. The stack type semiconductor package includes: a lower semiconductor package including a circuit board, a semiconductor chip which is disposed on an upper surface of the circuit board, via-pads which are arrayed on the upper surface of the circuit board around the semiconductor chip, and an encapsulation layer which encapsulates the upper surface of the circuit board and has via-holes through which the via-pads are exposed; and an upper semiconductor package which is stacked on the encapsulation layer, is electrically connected to the lower semiconductor package, and comprises internal connection terminals which are formed on a lower surface of the upper semiconductor package.

20 Claims, 11 Drawing Sheets

(51) Int. Cl.
*H01L 23/28* (2006.01)
*H01L 23/498* (2006.01)
*H01L 23/00* (2006.01)
*H01L 25/10* (2006.01)
*H01L 23/31* (2006.01)
*H01L 23/538* (2006.01)

(52) U.S. Cl.
CPC . *H01L 2225/1023* (2013.01); *H01L 2225/1041* (2013.01); *H01L 2225/1058* (2013.01); *H01L 2924/01033* (2013.01); *H01L 2924/01047* (2013.01); *H01L 2924/014* (2013.01); *H01L 2924/15311* (2013.01); *H01L 2924/18161* (2013.01); *H01L 2225/06565* (2013.01); *H01L 2224/16225* (2013.01); *H01L 2224/32145* (2013.01); *H01L 2224/32225* (2013.01); *H01L 2924/1815* (2013.01)
USPC .......................................... 257/686; 257/777

(56) References Cited

U.S. PATENT DOCUMENTS

| | | | |
|---|---|---|---|
| 2005/0184377 A1* | 8/2005 | Takeuchi et al. | 257/686 |
| 2006/0073635 A1* | 4/2006 | Su et al. | 438/109 |
| 2007/0141751 A1* | 6/2007 | Mistry et al. | 438/109 |
| 2008/0315385 A1 | 12/2008 | Gerber et al. | |

* cited by examiner

STACK TYPE SEMICONDUCTOR PACKAGE AND METHOD OF FABRICATING THE SAME

CROSS-REFERENCE TO RELATED APPLICATION

This application claims priority from Korean Patent Application No. 10-2010-0140674, filed on Dec. 31, 2010, in the Korean Intellectual Property Office, the disclosure of which is incorporated herein in its entirety by reference.

BACKGROUND

1. Field

Apparatuses and methods consistent with exemplary embodiments relate to a stack type semiconductor package and a method of fabricating the same, and more particularly, to a stack type semiconductor package in which a plurality of packages are stacked and a method of fabricating the same.

2. Description of the Related Art

A stack type semiconductor package is a package in which a plurality of semiconductor packages that have individually been packaged and electrically tested are vertically stacked. In a stack type semiconductor package, an upper semiconductor package should be stably stacked on a lower semiconductor package. If the pitches of external connection terminals of the upper semiconductor package of the stack type semiconductor package, i.e., the pitches of solder balls, are reduced and thus become fine, it is difficult to stack the upper semiconductor package on the lower semiconductor package.

SUMMARY

One or more exemplary embodiments described herein provide a stack type semiconductor package in which an upper semiconductor package, including external connection terminals having fine pitches, is easily stacked on a lower semiconductor package, and a method of fabricating the stack type semiconductor package.

According to an aspect of an exemplary embodiment, there is provided a stack type semiconductor package including: a lower semiconductor package which includes a circuit board, a semiconductor chip which is disposed on an upper surface of the circuit board, via-pads which are arrayed on the upper surface of the circuit board around the semiconductor chip, and an encapsulation layer which encapsulates the upper surface of the circuit board, protects the semiconductor chip and the via-pads, and has via-holes through which the via-pads are exposed; and an upper semiconductor package which is stacked on the encapsulation layer, is electrically connected to the lower semiconductor package, and comprises internal connection terminals which are formed on a lower surface of the upper semiconductor package.

The lower semiconductor package may further include external connection terminals which are arrayed on a lower surface of the circuit board. The semiconductor chip may be flip-chip mounted on the circuit board and may be electrically connected to the circuit board through chip connection terminals, and a back surface of the semiconductor chip is not covered by the encapsulation layer.

The stack type semiconductor package may further include redistribution layers which are connected to the via-pads through the via holes, extend onto the back surface of the semiconductor chip and the encapsulation layer, and are electrically connected to the internal connection terminals.

The redistribution layers may be a lead frame. The semiconductor chip may include chip-through electrodes which are electrically connected to the chip connection terminals.

The circuit board may include board-through electrodes which are electrically connected to the chip connection terminals.

The lower semiconductor package may include conductive wires which electrically connect the semiconductor chip to the circuit board, and the semiconductor chip, the via-pads, and the conductive wires may be encapsulated by the encapsulation layer. The lower semiconductor package may include redistribution layers disposed on the encapsulation layer and electrically connected to the via-pads and the internal connection terminals.

According to an aspect of another exemplary embodiment, there is provided a stack type semiconductor package including: a lower semiconductor package which includes a circuit board which includes board-through electrodes, a semiconductor chip which includes chip-through electrodes and is flip-chip mounted on an upper surface of the circuit board, wherein a back surface of the semiconductor chip is exposed to the outside, and the chip-through electrodes are electrically connected to the circuit board through the board-through electrodes, via-pads which are arrayed on the upper surface of the circuit board around the semiconductor chip, and an encapsulant layer which protects the semiconductor chip and has via holes therethrough and expose the via-pads; and an upper semiconductor package which is stacked on the encapsulation layer and electrically connected to the lower semiconductor package and comprises internal connection terminals which are formed on a lower surface of the upper semiconductor package.

The internal connection terminals of the upper semiconductor package may be electrically connected to the chip-through electrodes and the board-through electrodes.

Redistribution layers may be connected to the via-pads through the via-holes and be electrically connected to the internal connection terminals on the back surface of the semiconductor chip and the encapsulation layer, wherein the redistribution layers are electrically connected to the chip-through electrodes and the board-through electrodes.

According to an aspect of another exemplary embodiment, there is provided a method of fabricating a stack type semiconductor package, including: disposing a semiconductor chip on an upper surface of a circuit board; forming via-pads on the upper surface of the circuit board around the semiconductor chip; forming an encapsulation layer, which protects the semiconductor chip, on the circuit board over the via pads; forming via-holes exposing the via-pads; and stacking an upper semiconductor package on the encapsulation layer, where the upper semiconductor package includes internal connection terminals formed on a lower surface thereof, and electrically connecting the internal connection terminals to the lower semiconductor package.

Forming the via holes may include processing the encapsulation layer using a laser drill to form the via-holes. The method may further include forming redistribution layers which are connected to the via-pads in the via-holes and are disposed on the encapsulation layer.

Forming the redistribution layers may include disposing a lead frame having insertion parts on the encapsulation layer, inserting the insertion parts of the lead frame into the via-holes, and punching the lead frame.

The semiconductor chip may include a silicon substrate and chip-through electrodes formed therethrough.

The circuit board may include a silicon substrate and board-through electrodes formed therethrough.

A chip redistribution layer may be further formed on the chip-through electrodes so that the chip-through electrodes are connected to chip connection terminals, and a board redistribution layer may be further formed on the board-through electrodes so that the board-through electrodes are connected to external connection terminals. The circuit board may be formed of a printed circuit board (PCB) or a silicon substrate.

BRIEF DESCRIPTION OF THE DRAWINGS

The above and/or other aspects will be more clearly understood from the following detailed description of exemplary embodiments taken in conjunction with the accompanying drawings in which.

DETAILED DESCRIPTION

Figure 1:
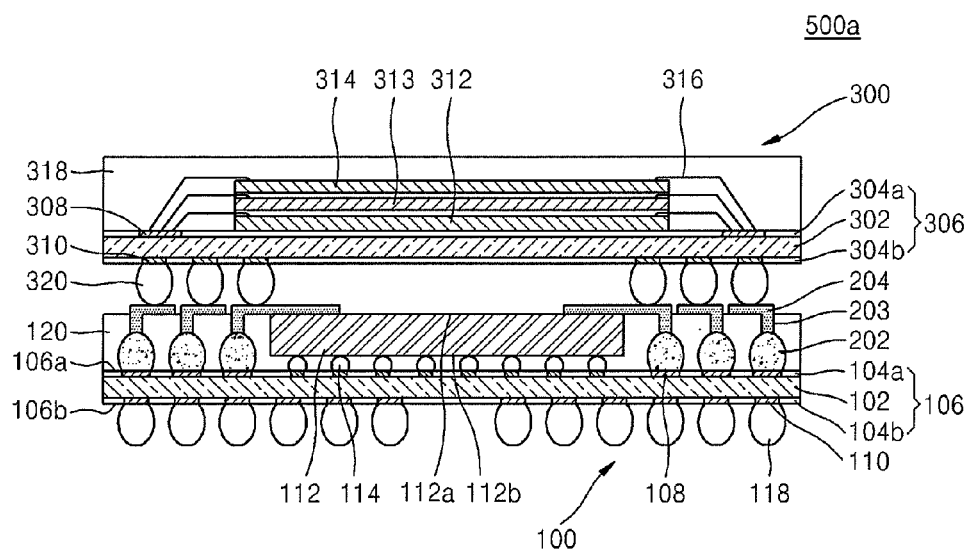
FIG. 1 is a cross-sectional view of a stack type semiconductor package according to an exemplary embodiment.

Exemplary embodiments will now be described more fully with reference to the accompanying drawings. The exemplary embodiments, however, should not be construed as being limited to the descriptions set forth herein. Like reference numerals in the drawings denote like elements, and thus their repeated description will be omitted. In the drawings, the thicknesses of layers and regions may be exaggerated for clarity.

The terminology used herein is for describing particular exemplary embodiments and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
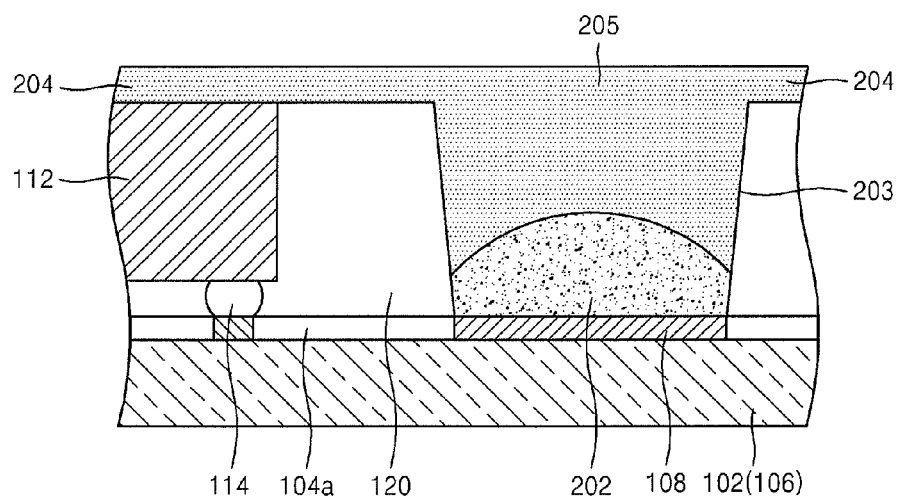
FIG. 2A is a partial enlarged view illustrating a connection relation between a via pad and a redistribution layer of FIG. 1, according to an exemplary embodiment.
Figure 2B:
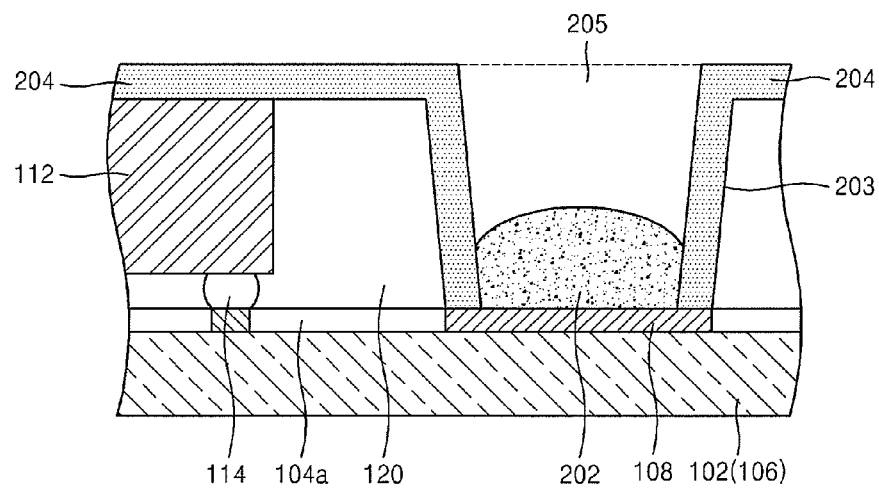
FIG. 2B is a partial enlarged view illustrating a connection relation between a via pad and a redistribution layer of FIG. 1, according to another exemplary embodiment.

FIG. 1 is a cross-sectional view of a stack type semiconductor package 500a according to an exemplary embodiment. FIG. 2A is a partial enlarged view illustrating a connection relation between a via-pad 202 and a redistribution layer 204 of FIG. 1, according to an exemplary embodiment. FIG. 2B is a partial enlarged view illustrating a connection relation between the via-pad 202 and the redistribution layer 204 of FIG. 1, according to another exemplary embodiment.

Referring to FIG. 1, the stack type semiconductor package 500a includes a lower semiconductor package 100 and an upper semiconductor package 300. The stack type semiconductor package 500a is referred to as a package-on-package (POP) in which the upper semiconductor package 300 is stacked on the lower semiconductor package 100.

The lower and upper semiconductor packages 100 and 300 correspond to packages which have been packaged and electrically tested individually. The lower semiconductor package 100 may be a logic semiconductor package which includes a logic semiconductor chip 112. The lower semiconductor package 100 may be a system-on-package (SOP) which includes a plurality of logic semiconductor chips 112 arranged in a plane. The upper semiconductor package 300 may be a memory semiconductor package, which includes memory semiconductor chips.

The lower semiconductor package 100 includes a circuit board 106 including a core layer 102 and photo-solder resist layers 104a and 104b. The circuit board 106 may be referred to as a wiring substrate. The circuit board 106 (circuit substrate) is a board or substrate on which circuit wires are formed, in a plane, and may be a printed circuit board (PCB). A plurality of first electrode pads 108 are formed on an upper surface of the core layer 102 of the circuit board 106 and are insulated from one another by the photo-solder resist layer 104a. The first electrode pads 108 may be arrayed at regular distances in the circuit board 106. A plurality of second electrode pads 110 are formed on a lower surface of the core layer 102 of the circuit board 106 and are insulated from one another by the photo-solder resist layer 104b.

External connection terminals 118 are respectively formed on the second electrode pads 110 to connect to an external device (not shown). The external connection terminals 118 may be solder balls. The first and second electrode pads 108 and 110 may be referred to as solder ball lands. Although not shown in FIG. 1 for convenience, the first electrode pads 108 are electrically connected to the second electrode pads 110 through wiring layers (not shown) which are formed through the core layer 102 of the circuit board 106.

The logic semiconductor chip 112 is disposed on an upper surface 106a of the circuit board 106 and is electrically connected to the circuit board 106 through chip connection terminals 114 and the first electrode pads 108. Although not shown in FIG. 1 for convenience, the logic semiconductor chip 112 is electrically connected to the first electrode pads 108 through the chip connection terminals 114 and wiring lines (not shown) arranged in the circuit board 106 in a plane.

The logic semiconductor chip 112 may be disposed on the circuit board 106 using a flip-chip method. Via-pads 202 are arrayed on the first electrode pads 108 of the circuit board 106. The via-pads 202 are arrayed using the same array method as that by which the first electrode pads 108 are arrayed. As shown in FIGS. 2A and 2B, the via-pads 202 may be formed on the first electrode pads 108 at appropriate heights i.e., at heights lower than upper surfaces of via-holes 203.

An encapsulation layer (a sealing layer) 120 is formed on a whole part of the upper surface 106a of the circuit board 106 and protects the logic semiconductor chip 112 and the via-pads 202. The encapsulation layer 120 exposes a back surface 112a of the logic semiconductor chip 112. The back surface 112a of the logic semiconductor chip 112 is an inactive surface on which circuit elements, such as transistors, etc., are not formed, and a surface 112b of the logic semiconductor chip 112 is an active surface on which circuit elements, such as transistors, etc., are formed.

If the encapsulation layer 120 is formed to expose the back surface 112a of the logic semiconductor chip 112, and the upper semiconductor chip 300 is stacked on the lower semiconductor chip 100, the overall thickness of the stack type semiconductor package 500a is reduced. The encapsulation layer 120 may also be formed of an epoxy resin or the like. The encapsulation layer 120 may be formed on the lower surface 106b of the circuit board 106 and may protect the photo-solder resist layer 104b and stably support the external connection terminals 118.

The via-holes 203 are formed in the encapsulation layer 120 and expose parts of the via-pads 202. The via-holes 203 may be formed by processing parts of the encapsulation layer 120 on the via-pads 202 using a laser drill. Since the via-pads 202 are formed to uniform heights, the via-holes 203 may be easily formed using the laser drill.

The redistribution layers 204 are formed and are electrically connected to the via-pads 202 through the via-holes 203, respectively. The redistribution layers 204 may be formed of conductive layers, e.g., metal layers such as copper layers. Redistribution pads (not shown) are formed on the logic semiconductor chip 112 or the encapsulation layer 120 and are electrically connected to the redistribution layers 204. The redistribution pads may have various shapes such as circular shapes, elliptical shapes, rectangular shapes, etc. The redistribution layers 204 are formed on upper surfaces of the via-pads 202 in the via-holes 203 and an upper surface of the encapsulation layer 120. The redistribution layers 204 may be formed on parts of the back surface 112a of the logic semiconductor chip 112.

As shown in FIG. 2A, the redistribution layers 204 may bury the via-pads 202 in the via-holes 203. As shown in FIG. 2B, the redistribution layers 204 are formed on sidewalls of the via-holes 203 and the first electrode pads 108. An insulating layer 205 may bury the via-pads 202 in the via-holes 203. The redistribution layers 204 may be electrically connected to the via-pads 202.

As described above, the lower semiconductor package 100 includes the circuit board 106, the first and second electrode pads 108 and 110, the logic semiconductor chip 112, the chip connection terminals 114, the external connection terminals 118, the encapsulation layer 120, the via-pads 202, and the redistribution layers 204. Since the lower semiconductor package 100 is processed using a laser drill, the lower semiconductor package 100 may be referred to as a laser drill package (LDP).

The upper semiconductor package 300 is vertically stacked on the lower semiconductor package 100 and is attached to the lower semiconductor package through the redistribution layers 204. Internal connection terminals 320 of the upper semiconductor package 300 are connected to the redistribution layers 204, and thus the upper semiconductor package 300 is electrically connected to the lower semiconductor package 100. The upper semiconductor package 300 may be a multichip package.

The upper semiconductor package 300 will now be described in more detail. Like the lower semiconductor package 100, the upper semiconductor package 300 includes a circuit board 306 including a core layer 302 and photo-solder resist layers 304a and 304b. Third electrode pads 308 are formed on an upper surface of the circuit board 306 and are insulated by the photo-solder resist layer 304a. For convenience, two third electrode pads 308 are shown in FIG. 1. Semiconductor chips 312, 313, and 314 are formed on the circuit board 306 with adhesive layers between the semiconductor chips 312, 313, and 314.

The semiconductor chips 312, 313, and 314 are connected to the third electrode pads 308 using conductive wires 316. FIG. 1 illustrates a plurality of conductive wires 316 connected to one third electrode pad 308. However, each conductive wire may be connected to a separate third electrode pad 308. An encapsulation layer is formed on the circuit board 306 on which the semiconductor chips 312, 313, and 314 and the conductive wires 316 are formed. The semiconductor chips 312, 313, and 314 are connected to the circuit board 306 through the conductive wires 316 in FIG. 1 but, alternately, may be connected to the circuit board 306 by using a flip-chip method.

A plurality of fourth electrode pads 310 are formed on a lower surface of the circuit board 306 and are insulated from one another by the photo-solder resist layer 304b. The internal connection terminals 320 are formed on the fourth electrode pads 310. The internal connection terminals 320 are stacked on the redistribution layers 204 to electrically connect the upper semiconductor package 300 to the lower semiconductor package 100. The internal connection terminals 320 may be solder balls.

As described above, in a stack type semiconductor package 500a according to the current embodiment, the via-pads 202 are arrayed in the encapsulation layer 120 formed on the upper surface 106a of the circuit board 106 of the lower semiconductor package 100, and the redistribution layers 204 are formed on the via-pads 202.

In this case, the redistribution layers 204 may address the issue of the fine pitches between the internal connection terminals 320 of the upper semiconductor package 300 stacked on the lower semiconductor package 100. In other words, even if the internal connection terminals 320 of the upper semiconductor package 300 have small pitches therebetween, the internal connection terminals 320 may be easily stacked on the lower semiconductor package 100. Since the upper semiconductor package 300 is stacked on the encapsulation layer 120, on which the redistribution layers 204 are formed, on the upper surface 106a of the circuit board 106, the overall thickness of the stack type semiconductor package 500a is reduced.

Accordingly, in a stack type semiconductor package 500*a* according to the current embodiment, the upper semiconductor package 300, including the external connection terminals 320 having small pitches therebetween, is easily stacked on the lower semiconductor package 100.

The redistribution layers 204 of the stack type semiconductor package 500*a* may be formed on a back surface 112*a* of the logic semiconductor chip 112. Thus, as noted above, the stack type semiconductor package 500*a* may fully address the issue of the fine pitches between the internal connection terminals 320 of the upper semiconductor package 300 stacked on the lower semiconductor package 100 and may simultaneously increase areas of the internal connection terminals 320.

If the redistribution layers 204 are formed on the back surface 112*a* of the logic semiconductor chip 112, the internal connection terminals 320 of the upper semiconductor package 300 may be formed directly over the logic semiconductor chip 112. Therefore, sizes of the semiconductor chips 312 of the upper semiconductor package 300 may be reduced, and the internal connection terminals 320 may be widely arrayed on a back surface of the upper semiconductor package 300.

Accordingly, the via-pads 202 and the redistribution layers 204 having fine pitches may be formed in the lower semiconductor package 100 to correspond to the upper semiconductor package 300 including the internal connection terminals 320 having fine pitches. Therefore, an overall size or thickness of the stack type semiconductor package 500*a* is reduced.

Also, a large number of via-pads 202 and a large number of redistribution layers 204 having fine pitches may be formed in the lower semiconductor package 100 to correspond to respectively a large number of internal connection terminals 320 of the upper semiconductor package 300, thereby completing the stack type semiconductor package 500*a*.

Figure 3:
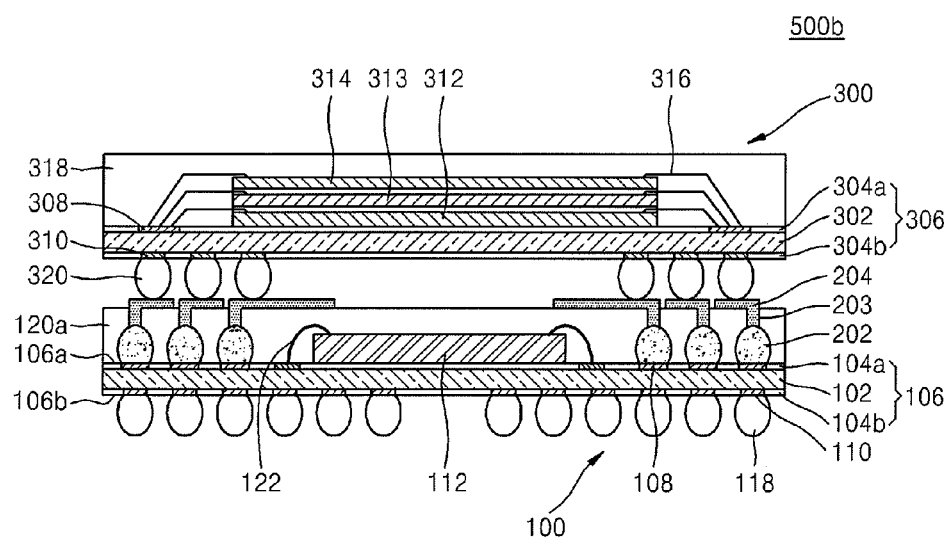
FIG. 3 is a cross-sectional view of a stack type semiconductor package according to another exemplary embodiment.

FIG. 3 is a cross-sectional view of a stack type semiconductor package 500*b* according to another exemplary embodiment.

Referring to FIG. 3, the stack type semiconductor package 500*b* has the same structure and effect as the stack type semiconductor package 500*a* of the previous embodiment except that a logic semiconductor chip 112 is connected to a circuit board 106 through conductive wires 122.

In the stack type semiconductor package 500*b* of the current embodiment, an adhesive layer (not shown) is interposed between the circuit board 106 and the logic semiconductor chip 112 to mount the logic semiconductor chip 112 on the circuit board 106. Also, the logic semiconductor chip 112 is electrically connected to the circuit board 106 through the conductive wires 122 using a wire bonding method. In other words, in the stack type semiconductor package 500*b*, the logic semiconductor chip 112 is electrically connected to the circuit board 106 using the wire bonding method, and not the flip-chip method of the previous embodiment.

An encapsulation layer 120*a* is formed on an upper surface of the circuit board 106 and protects the conductive wires 122, the logic semiconductor chip 112, and via-pads 202. In the stack type semiconductor package 500*b*, the encapsulation layer 120*a* is also formed on an active surface of the logic semiconductor chip 112 due to the use of the conductive wires 122. In the encapsulation layer 120*a*, redistribution layers 204 are respectively formed on the via-pads 202 in via-holes 203, and then an upper semiconductor package 300 having internal connection terminals 310 is stacked on the redistribution layers 204, thereby completing the stack type semiconductor package 500*b*.

FIGS. 4 through 7 are cross-sectional views illustrating a method of fabricating the stack type semiconductor package 500*a* of FIG. 1, according to an exemplary embodiment.

Figure 4:
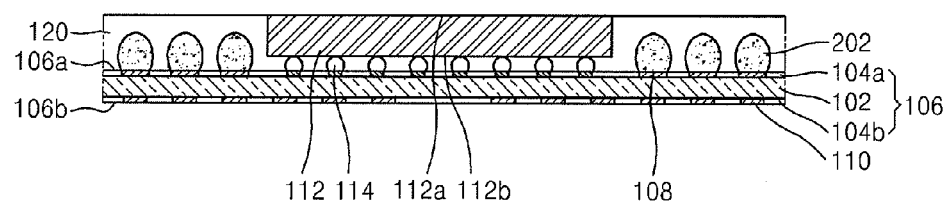
FIGS. 4 through 7 are cross-sectional views illustrating a method of fabricating the stack type semiconductor package of FIG. 1, according to an exemplary embodiment.

Referring to FIG. 4, the circuit board 106, including the core layer 102, the photo-solder resist layers 104*a* and 104*b*, and the first and second electrode pads 108 and 110, is provided. The via-pads 202 are formed on the upper surface 106*a* of the circuit board 106.

The logic semiconductor chip 112 having the chip connection terminals 114 is mounted on the circuit board 106 using the flip-chip method. In other words, the logic semiconductor chip 112 is mounted on the circuit board 106 using a flip-chip attaching process. In The flip-chip method, the logic semiconductor chip 112 is mounted on the circuit board 106 by positioning down the active surface 112*b* of the logic semiconductor chip 112. The logic semiconductor chip 112 is electrically connected to the first electrode pads 108 through the chip connection terminals 114 on the circuit board 106.

For convenience, one semiconductor chip 112 is shown as mounted on the circuit board 106 in FIG. 4, but a plurality of semiconductor chips 112 may be mounted on a base circuit board.

The encapsulation layer 120 is formed, exposing the back surface 112*a* of the logic semiconductor chip 112, and encapsulates the circuit board 106, the logic semiconductor chip 112, and the via-pads 202. In other words, the encapsulation layer 120 is formed to encapsulate a whole part of the upper surface 106*a* of the circuit board 106 on which the logic semiconductor chip 112 and the via-pads 202 are formed.

Figure 5:
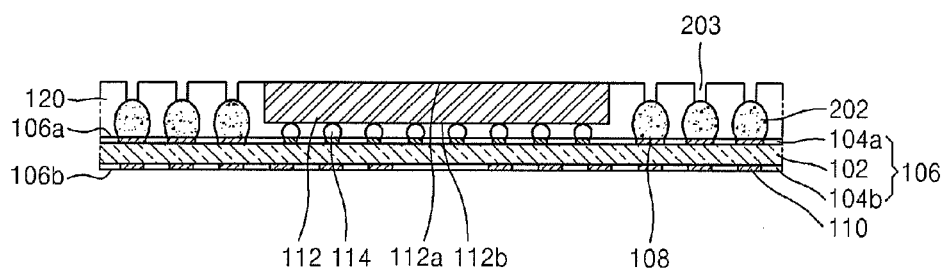

Referring to FIG. 5, the parts of the encapsulation layer 120 on the via-pads 202 are processed by the laser drill to form the via-holes 203. Since the via-pads 202 are formed in the encapsulation layer 120 at uniform heights, the via-holes 203 are easily formed.

Figure 6:
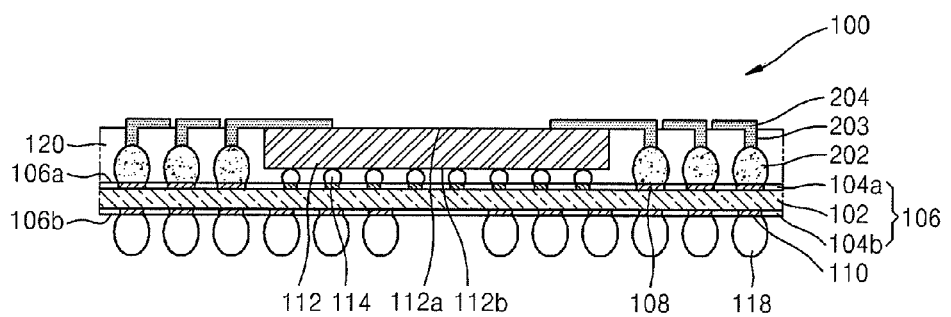

Referring to FIG. 6, the redistribution layers 204 are formed on the via-pads 202 in via-holes 203. The redistribution layers 204 may fill inner parts of the via-holes 203, as described above, or may be formed on sidewalls of the via-holes 203 as shown in FIG. 2B. The redistribution layers 204 are electrically connected to the via-pads 202, respectively.

A back end process is performed on the circuit board 106 on which the first and second electrode pads 108 and 110 and the redistribution layers 204 are formed. The back end process refers to a process of performing singulation: cutting the circuit board 106 into semiconductor chip units; and forming the external connection terminals 118 underneath the circuit board 106.

Accordingly, the lower semiconductor package 100, including the circuit board 106, the first and second electrode pads 108 and 110, the logic semiconductor chip 112, the chip connection terminals 114, the via-pads 202, the redistribution layers 204, and the external connection terminals 118, is completely manufactured.

Figure 7:
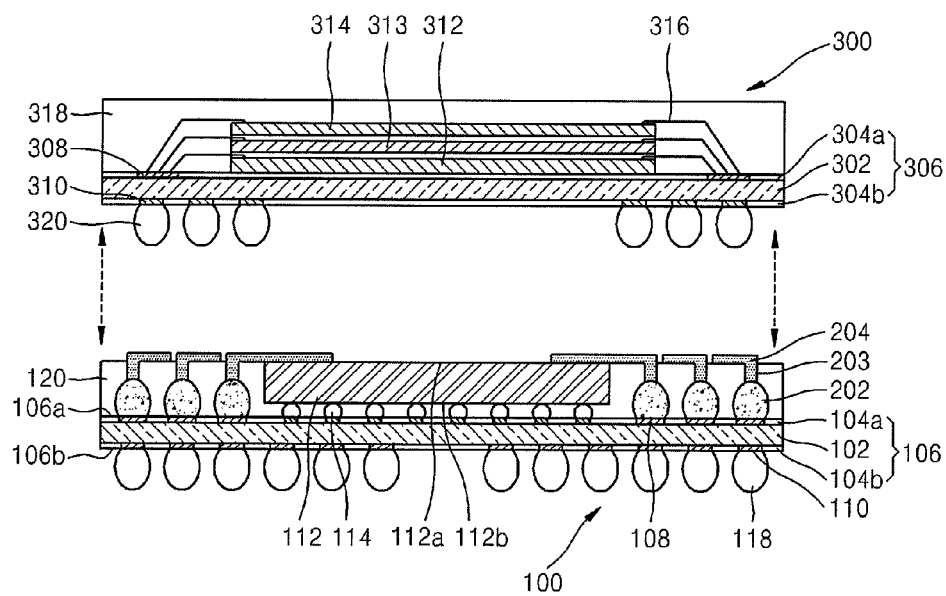

Referring to FIG. 7, the upper semiconductor package 300 is provided as described above. The upper semiconductor package 300 having the internal connection terminals 320 is vertically stacked on and electrically connected to the lower semiconductor package 100 through the redistribution layers 204, thereby completing the manufacture of the stack type semiconductor package 500*a*.

Figure 8:
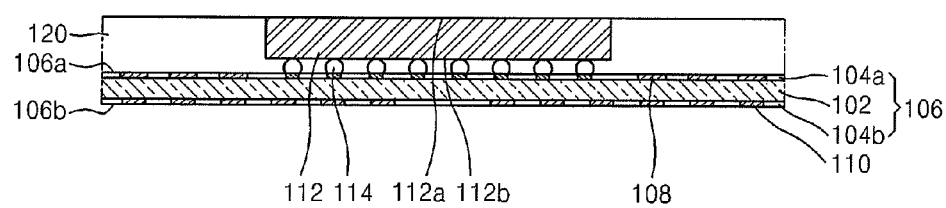
FIGS. 8 and 9 are cross-sectional views illustrating a method of fabricating the stack type semiconductor package of FIG. 1, according to another exemplary embodiment.
Figure 9:
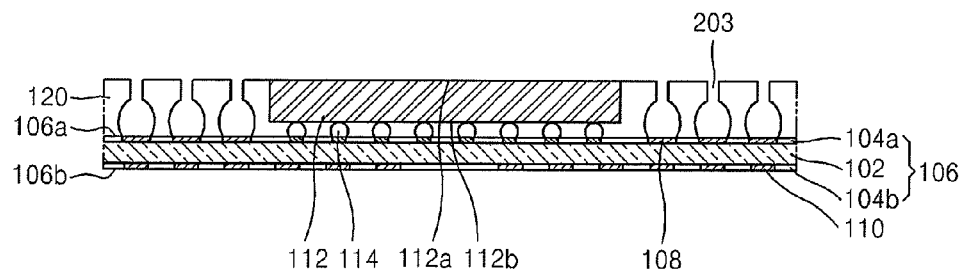

FIGS. 8 and 9 are cross-sectional views illustrating a method of fabricating the stack type semiconductor package 500*a* of FIG. 1, according to another exemplary embodiment.

In more detail, the method of the current embodiment is the same as that of the previous embodiment described with reference to FIGS. 4 through 7 except that the via-pads 202 are formed after the via-holes 203 are formed.

Referring to FIG. 8, the circuit board 106, including the core layer 102, the photo-solder resist layers 104a and 104b, and the first and second electrode pads 108 and 110, is provided. The logic semiconductor chip 112 having the chip connection terminals 114 is mounted on the circuit board 106 using the flip-chip method.

The encapsulation layer 120 is formed, exposes the back surface (the inactive surface) 112a of the logic semiconductor chip 112, and encapsulates the circuit board 106 and the logic semiconductor chip 112. In other words, the encapsulation layer 120 is formed to encapsulate the whole part of the upper surface 106a of the circuit board 106 on which the logic semiconductor chip 112 is formed.

Referring to FIG. 9, parts of the encapsulation layer 120 on the first electrode pads 108 are processed using the laser drill to form the via-holes 203. As shown in FIG. 5, the via-pads 202 are formed in the via-holes 203. The via-pads 202 are formed to uniform heights in the via-holes 203. If the via-pads 202 are formed after the via-holes 203 are formed, the via-pads 202 may be stably formed in the encapsulation layer 120, and the heights of the via-pads 202 may be easily adjusted.

As shown in FIG. 6, the redistribution layers 204 are respectively formed on the via-pads 202. After the redistribution layers 204 are formed, the back end process is performed to complete the lower semiconductor package 100. As shown in FIG. 7, the upper semiconductor package 300 is vertically stacked on the lower semiconductor package 100 through the redistribution layers 204, thereby completing the manufacture of the stack type semiconductor package 500a.

Figure 10:
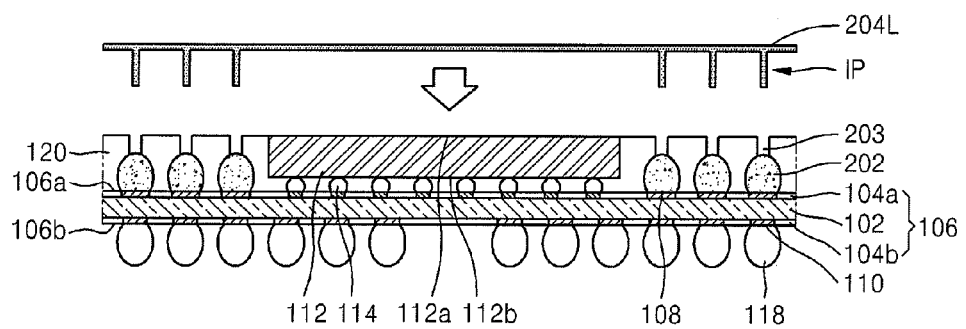
FIGS. 10 through 12 are cross-sectional views illustrating a method of fabricating the stack type semiconductor package of FIG. 1, according to another exemplary embodiment.
Figure 11:
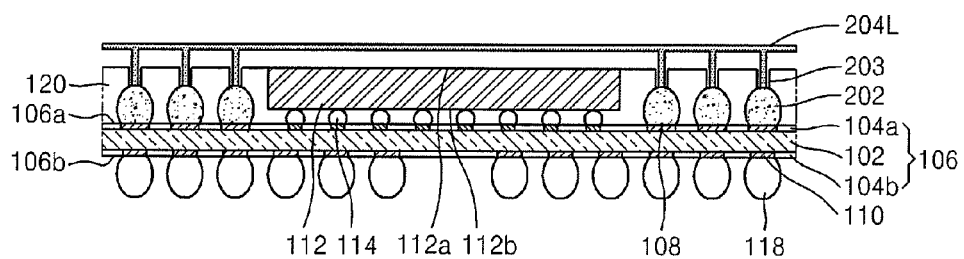
Figure 12:
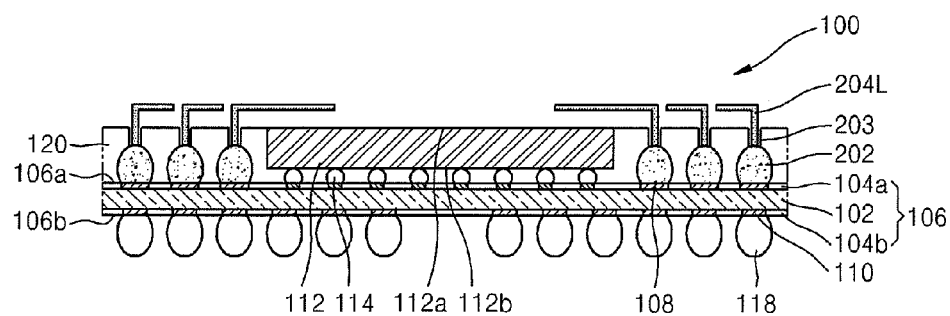

FIGS. 10 through 12 are cross-sectional views illustrating a method of fabricating the stack type semiconductor package 500a of FIG. 1, according to another exemplary embodiment.

In more detail, the method of the current embodiment is the same as those of the previous embodiments described with reference to FIGS. 4 through 7 and FIGS. 8 and 9 except that the redistribution layers 204 are formed using a lead frame. The method of FIGS. 10 through 12 will be described with reference to the method described with reference to FIGS. 4 through 7.

Referring to FIGS. 10 and 11, the process described with reference to FIGS. 4 and 5 is performed. In this case, as shown in FIG. 10, the via-pads 202 and the via-holes 203 are formed on the circuit board 106.

As shown in FIG. 10, a lead frame 204L having insertion parts IP is located to correspond to the via-holes 203. The lead frame 204L is mainly cheaply used in a semiconductor package process and has various shapes, as would be understood by one of skill in the art, and thus will not be separately described. The lead frame 204 is named a lead frame in the current embodiment but may be referred to as a metal layer having the insertion parts IP.

The lead frame 204L may be easily formed as the redistribution layers 204, as will be described below. As shown in FIGS. 10 and 11, the insertion parts IP of the lead frame 204L are inserted into the via-holes 203 and thus are electrically connected to the via-pads 202.

Referring to FIG. 12, the lead frame 204L is patterned using a punching process to form the redistribution layers 204. For convenience, the redistribution layers 204 are illustrated as spaced above the encapsulation layer 120 in FIGS. 11 and 12 but may be adhered onto the encapsulation layer 120. Redistribution pads (not shown) may be formed in the redistribution layers 204. The redistribution pads are formed in the lead frame 204L, which is formed as the redistribution layers 204.

As shown in FIG. 6, after the redistribution layers 204 are formed, the back end process is performed to complete the lower semiconductor package 100. As shown in FIG. 7, the upper semiconductor package 300 is vertically stacked on the lower semiconductor package 100 through the redistribution layers 204, thereby completing the manufacture of the stack type semiconductor package 500a.

Figure 13:
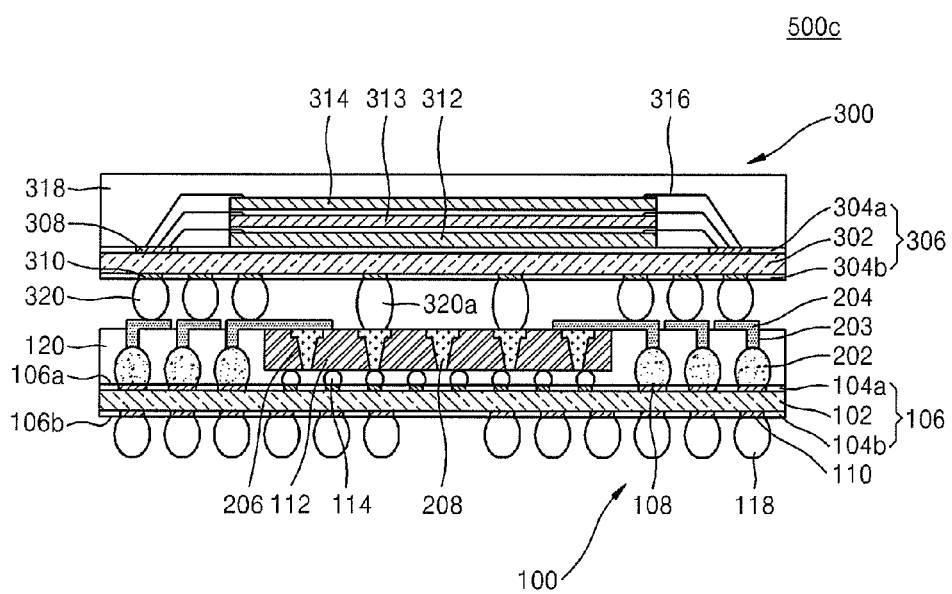
FIG. 13 is a cross-sectional view of a stack type semiconductor package according to another exemplary embodiment.
Figure 14:
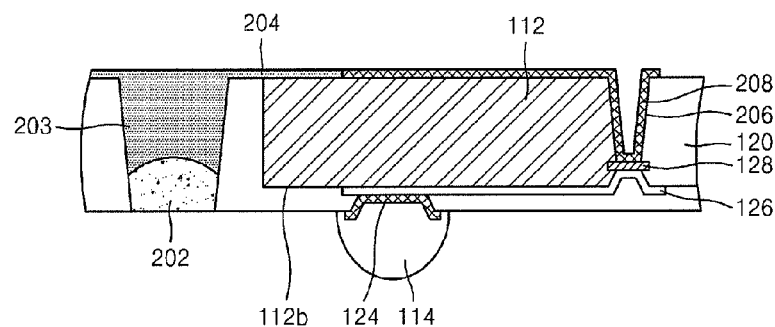
FIG. 14 is a partial enlarged view illustrating a connection relation between a redistribution layer and a chip-through electrode of FIG. 13, according to an exemplary embodiment.

FIG. 13 is a cross-sectional view of a stack type semiconductor package 500c according to another exemplary embodiment. FIG. 14 is a partial enlarged view illustrating a connection relation between a redistribution layer 204 and a chip-through electrode 208 of FIG. 13, according to an exemplary embodiment.

In more detail, the stack type semiconductor package 500c of the current embodiment has the same structure and effect as the stack type semiconductor package 500a of FIG. 1, except that chip-through electrodes 208 are formed in a logic semiconductor chip 112.

Referring to FIG. 13, in the stack type semiconductor package 500c, the chip-through electrodes 208 are formed in a semiconductor substrate forming the logic semiconductor chip 112, e.g., in a silicon substrate. Internal connection terminals 320a of an upper semiconductor package 300 are stacked on the chip-through electrodes 208, and internal connection terminals 320 of the upper semiconductor package 300 are stacked on redistribution layers 204.

Chip-through holes 206 are formed in the silicon substrate forming the logic semiconductor chip 112, and conductive layers (not shown) are formed in the chip-through holes 206 and the logic semiconductor chip 112, thereby forming the chip-through electrodes 208. The conductive layers may be formed in the chip-through holes 206, and redistribution conductive layers may be formed to be connected to the conductive layers, thereby forming the chip-through electrodes 208.

The chip-through electrodes 208 may fill the chip-through holes 206, as shown in FIG. 13, or may be formed on sidewalls of the chip-through holes 206, as shown in FIG. 14. The chip-through electrodes 208 are electrically connected to the redistribution layers 204 connected to via-pads 202, respectively.

A chip redistribution layer 126 may be formed on an active surface 112b of the logic semiconductor chip 112. If the chip redistribution layer 126 is used, the chip-through electrodes 208 are easily electrically connected to chip connection terminals 114. In FIG. 14, reference numerals 124 and 128 denote pad metal layers.

Therefore, in the stack type semiconductor package 500c having the above-described structure, internal connection terminals 320a of the upper semiconductor package 300 are directly connected to a circuit board 106 through the chip-through electrodes 208, the chip redistribution layer 126, and the chip connection terminals 114. In this case, an electric connection distance between the logic semiconductor chip 112 and the circuit board 106 may be shortened to improve a performance of the stack type semiconductor package 500c.

Also, in the stack type semiconductor package 500c, the internal connection terminals 320 of the upper semiconductor package 300 are connected to the circuit board 106 through the redistribution layers 204, the chip-through electrodes 208, the chip redistribution layer 126, and the chip connection terminals 114.

As described above, in the stack type semiconductor package 500c, the internal connection terminals 320a of the upper semiconductor package 300 may be connected to the circuit board 106 through the redistribution layers 204 or may be directly connected to the circuit board 106 not through the redistribution layers 204. Therefore, various connection paths may be realized.

Figure 15:
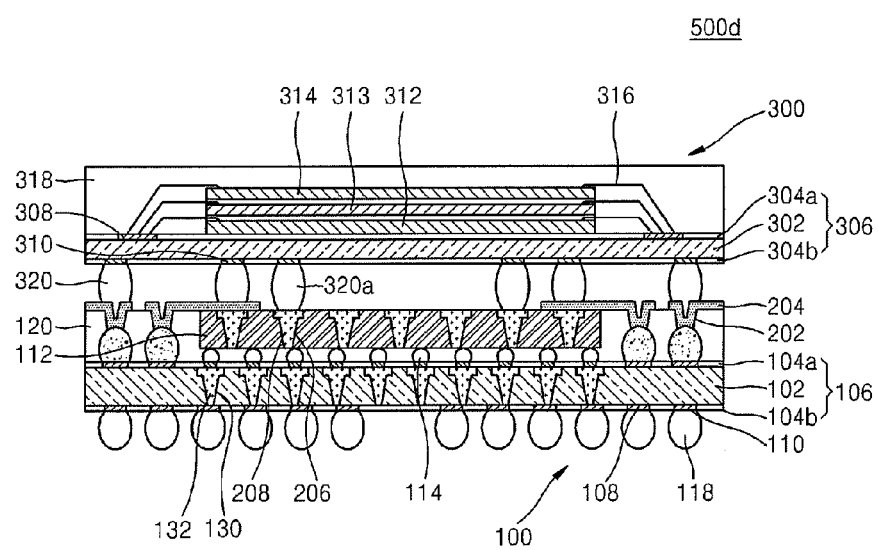
FIG. 15 is a cross-sectional view of a stack type semiconductor package according to another exemplary embodiment.
Figure 16:
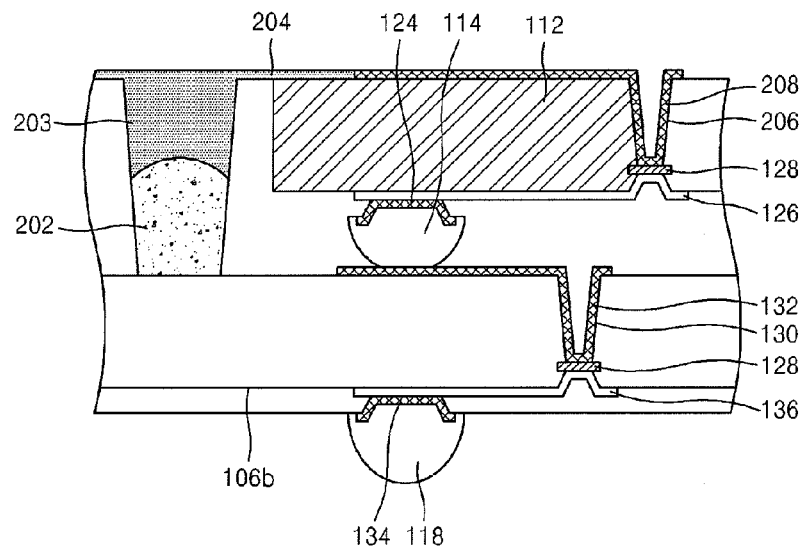
FIG. 16 is a partial enlarged view illustrating a connection relation between a chip connection terminal and an external connection terminal of FIG. 15, according to an exemplary embodiment.

FIG. 15 is a cross-sectional view of a stack type semiconductor package 500*d* according to another exemplary embodiment. FIG. 16 is a partial enlarged view illustrating a connection relation between a chip connection terminal 114 and an external connection terminal 118 of FIG. 15, according to an exemplary embodiment.

In more detail, the stack type semiconductor package 500*d* of the current embodiment has the same structure and effect as the stack type semiconductor package 500*c* of FIG. 13, except that board-through electrodes 132 are formed in a circuit board 106.

In the stack type semiconductor package 500*d*, board through-holes 130 are formed in the circuit board 106, and the board-through electrodes 132 are formed in the board through-holes 130. The circuit board 106 may be formed of a silicon substrate. The board through-holes 130 are formed in the silicon substrate forming the circuit board 106, and conductive layers are formed in the board through-holes 130, thereby forming the board-through electrodes 132. Conductive layers may be formed in the board through-holes 130, and redistribution conductive layers may be formed to be connected to the conductive layers, thereby forming the board-through electrodes 132.

The board-through electrodes 132 may bury the board through-holes 130, as shown in FIG. 15, or may be formed on sidewalls of the board through-holes 130, as shown in FIG. 16. The board-through electrodes 132 are respectively connected to chip connection terminals 114.

A board redistribution layer 136 may be formed on a back surface 106*b* of the circuit board 106. If the board redistribution layer 136 is used, the board-through electrodes 132 are easily electrically connected to external connection terminals 118. In FIG. 16, reference numerals 134 and 128 denote pad metal layers.

In the stack type semiconductor package 500*d* having the above-described structure, the chip connection terminals 114 are directly connected to the external connection terminals 118 through the board-through electrodes 132 and the board redistribution layer 136. In this case, an electric connection distance between the logic semiconductor chip 112 and the external connection terminals 118 may be shortened to improve a performance of the stack type semiconductor package 500*d*.

FIG. 17 through 20 are cross-sectional views illustrating a method of fabricating the stack type semiconductor package 500*d* of FIG. 15, according to an exemplary embodiment.

Figure 17:
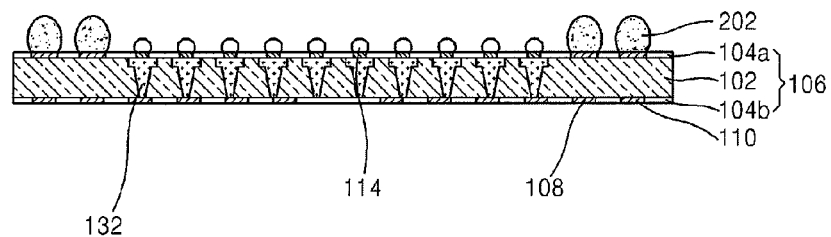
FIG. 17 through 20 are cross-sectional views illustrating a method of fabricating the stack type semiconductor package of FIG. 15, according to an exemplary embodiment.

Referring to FIG. 17, the circuit board 106, including a core layer 102, photo-solder resist layers 104*a* and 104*b*, and first and second electrode pads 108 and 110, is provided. The board-through electrodes 132 are formed in the circuit board 106, and the via-pads 202 and the chip connection terminals 114 are formed on the circuit board 106.

Figure 18:
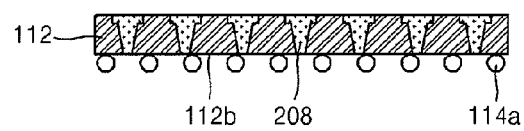

Referring to FIG. 18, the logic semiconductor chip 112 having the chip-through electrodes 208 is provided. Chip connection terminals 114*a* may be formed on a lower surface 112*b* (an active surface) of the logic semiconductor chip 112.

Figure 19:
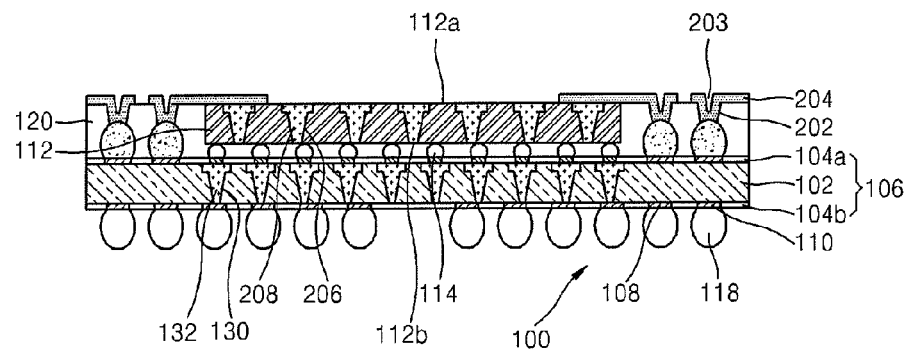

Referring to FIG. 19, the logic semiconductor chip 112 is mounted on the circuit board 106 through the chip connection terminals 114 using a flip-chip method. In other words, the logic semiconductor chip 112 is mounted on the circuit board 106 using a flip-chip attaching process. In the flip-chip method, the logic semiconductor chip 112 is mounted on the circuit board 106 by positioning down the active surface 112*b* of the logic semiconductor chip 112. The logic semiconductor chip 112 is electrically connected to the first electrode pads 108 through the chip connection terminals 114 and the board-through electrodes 132 in the circuit board 106.

An encapsulation layer 120 is formed, exposes a back surface (an inactive surface) 112*b* of the logic semiconductor chip 112, and completely molds the circuit board 106, the logic semiconductor chip 112, and the via-pads 202. In other words, the encapsulation layer 120 is formed to mold a whole part of an upper surface of the circuit board 106 on which the logic semiconductor chip 112 and the via-pads 202 are formed.

As described above, parts of the encapsulation layer 120 on the via-pads 202 are processed using a laser drill to form via-holes 203. Redistribution layers 204 are formed on the via-pads 202. The redistribution layers 204 may fill the via-holes 103 or may be formed on sidewalls of the via-holes 203, as described above. As described above, a back end process is performed on the circuit board 106 on which the first and second electrode pads 108 and 110 and the redistribution layers 204 are formed, thereby completing the manufacture of a lower semiconductor package 100.

Figure 20:
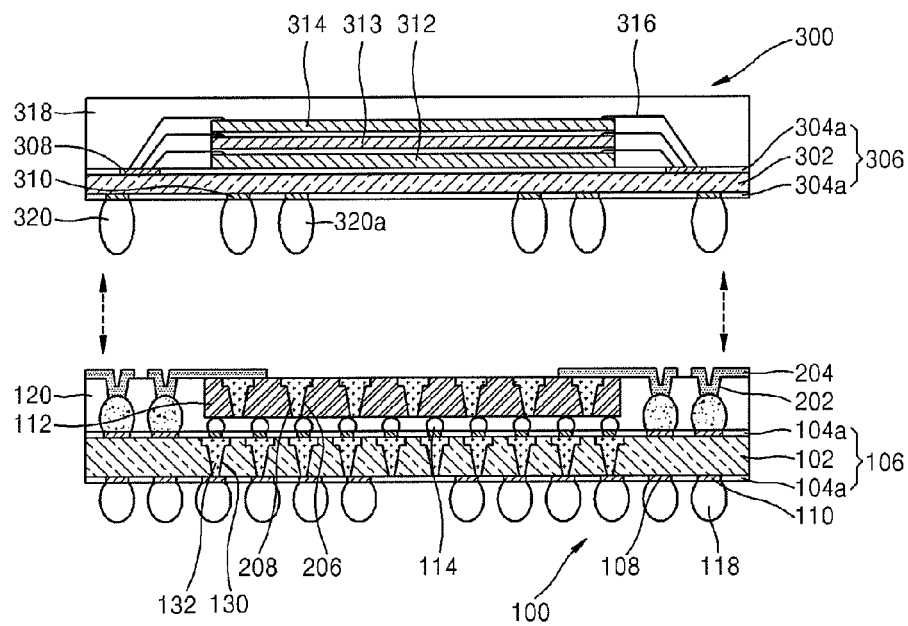

Referring to FIG. 20, an upper semiconductor package 300, as described above, is provided. The upper semiconductor package 300 having internal connection terminals 320 is vertically stacked on and electrically connected to the lower semiconductor package 100 through the chip-through electrodes 208. Accordingly, the stack type semiconductor package 500*d* is completely manufactured.

Figure 21:
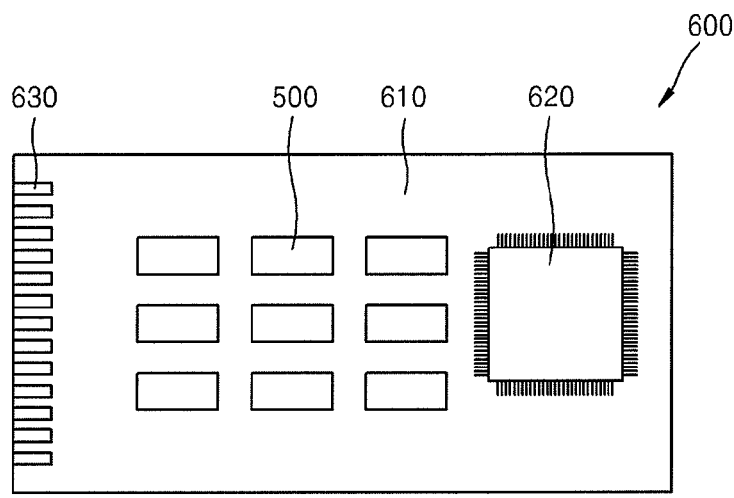
FIG. 21 is a schematic plan view illustrating a structure of a package module using a stack type semiconductor package, according to an exemplary embodiment.
Figure 22:
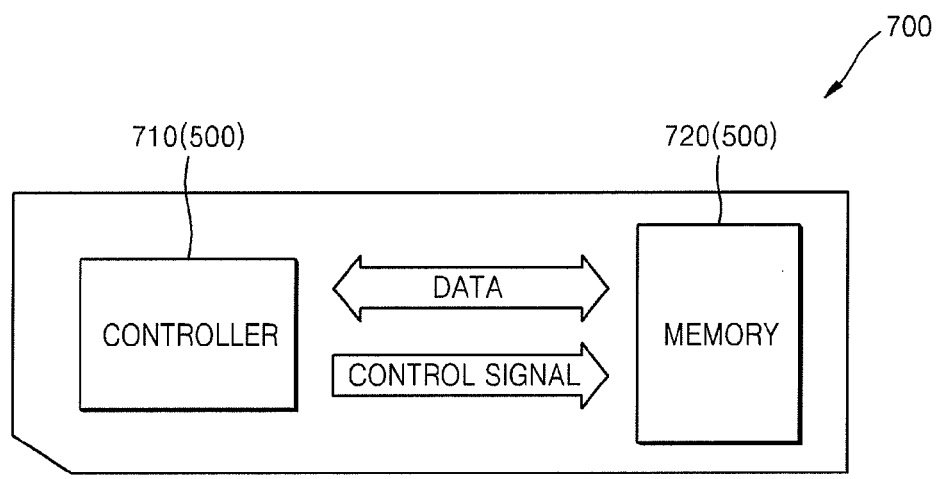
FIG. 22 is a schematic block diagram illustrating a structure of a card using a stack type semiconductor package, according to an exemplary embodiment.
Figure 23:
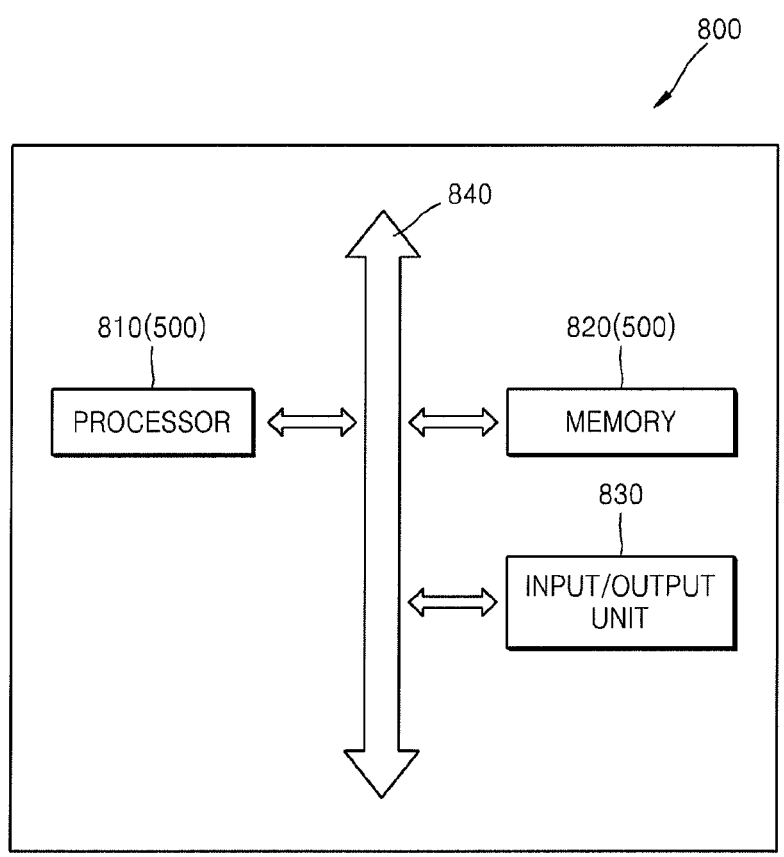
FIG. 23 is a schematic block diagram illustrating a structure of an electronic system using a stack type semiconductor package, according to an exemplary embodiment.

Various applications using the stack type semiconductor packages 500*a*, 500*b*, and 500*c* according to the exemplary embodiments will now be described. Some of the applications will be described. In FIGS. 21 through 23, stack type semiconductor packages according to the inventive concept are denoted by reference numeral 500.

FIG. 21 is a schematic plan view illustrating a structure of a package module 600 using stack type semiconductor packages 500, according to an exemplary embodiment.

Referring to FIG. 21, the stack type semiconductor packages 500 according to the inventive concept may be applied to the package module 600. The stack type semiconductor packages 500 are attached onto a module substrate 610, in the package module 600. A package 620 is attached onto a side of the package module 600, and external connection terminals 630 are positioned on the other side of the package module 600. The stack type semiconductor packages 500 may not be limitedly applied to the package module 600 of the current embodiment and may be applied to various types of package modules.

FIG. 22 is a schematic block diagram of a card 700 using stack type semiconductor packages 500, according to an exemplary embodiment.

In more detail, the stack type semiconductor packages 500 may be applied to the card 700. The card 700 may be a multimedia card (MMC), a secure digital card (SD), or the like. The card 700 includes a controller 710 and a memory 720. The memory 720 may be a flash memory, a phase change random access memory (PRAM), or another type of non-volatile memory. The controller 710 transmits a control signal to the memory 720, and thus the controller 710 and the memory 720 exchange data with each other according to the control signal.

The stack type semiconductor packages 500, as described above, may be used in the controller 710 and the memory 720 of the card 700 of the current embodiment. In this case, the card 700 may have a large memory capacity and include the controller 710 having various functions. Also, a thickness of the card 700 may be thin, and lengths of wires may be shortened, thereby improving the performance of the card 700.

FIG. 23 is a schematic block diagram of an electronic system 800 using stack type semiconductor packages 500, according to an exemplary embodiment.

In more detail, the electronic system 800 according to the current embodiment may be a computer, a mobile phone, a MPEG audio layer-3 (MP3) player, a navigator, or the like. The electronic system 800 includes a processor 810, a memory 820, and an input/output (I/O) unit 830. A control signal or data is exchanged between the processor 810 and the memory 820 or the I/O unit 830 through a communication channel 840.

The stack type semiconductor packages 500 may be used in the processor 810 and the memory 820 of the electronic system 800. In this case, the electronic system 800 may realize various functions and may have improved reliability.

While the inventive concept has been particularly shown and described with reference to exemplary embodiments thereof, it will be understood that various changes in form and details may be made therein without departing from the spirit and scope of the following claims.

What is claimed is:

1. A stack type semiconductor package comprising:
a lower semiconductor package comprising: a circuit board, a semiconductor chip which is disposed on an upper surface of the circuit board, via-pads which are arrayed on the upper surface of the circuit board around the semiconductor chip, and an encapsulation layer which encapsulates the upper surface of the circuit board and has via-holes through which the via-pads are exposed; and
an upper semiconductor package which is stacked on the encapsulation layer, is electrically connected to the lower semiconductor package, and comprises internal connection terminals which are formed on a lower surface of the upper semiconductor package.
wherein the stack type semiconductor package further comprises redistribution layers which are electrically connected to and contacting the via-pads through the via-holes and are electrically connected to and contacting the internal connection terminals, and
wherein the redistribution layers are formed to protrude inside the via-holes and contact sidewalls of the via-holes.

2. The stack type semiconductor package of claim 1, wherein the lower semiconductor package further comprises external connection terminals which are arrayed on a lower surface of the circuit board.

3. The stack type semiconductor package of claim 1, wherein the semiconductor chip is flip-chip mounted on the circuit board and is electrically connected to the circuit board through chip connection terminals, and a back surface of the semiconductor chip is not covered by the encapsulation layer.

4. The stack type semiconductor package of claim 3, wherein the redistribution layers extend onto the back surface of the semiconductor chip and the encapsulation layer.

5. The stack type semiconductor package of claim 4, wherein the redistribution layers comprise a lead frame.

6. The stack type semiconductor package of claim 3, wherein the semiconductor chip comprises chip-through electrodes which are electrically connected to the chip connection terminals.

7. The stack type semiconductor package of claim 6, wherein the circuit board comprises board-through electrodes which are electrically connected to the chip connection terminals.

8. The stack type semiconductor package of claim 1, wherein the lower semiconductor package further comprises conductive wires which electrically connect the semiconductor chip to the circuit board, and the semiconductor chip, the via-pads, and the conductive wires are encapsulated by the encapsulation layer.

9. The stack type semiconductor package of claim 8, wherein the redistribution layers disposed on the encapsulation layer.

10. A stack type semiconductor package comprising:
a lower semiconductor package comprising:
a circuit board,
a semiconductor chip mounted on an upper surface of the circuit board,
via pads which are arrayed on the upper surface of the circuit board around the semiconductor chip,
an encapsulation layer encapsulating the upper surface of the circuit board, the encapsulation layer comprising via holes through which the via pads are exposed,
redistribution layers formed on an upper surface of the encapsulating layer and an upper surface of the semiconductor chip and electrically connected to the via pads through the via holes; and
an upper semiconductor package stacked on the lower semiconductor package, the upper semiconductor package comprising:
internal connection terminals disposed on a lower surface of the upper semiconductor package and electrically connected to the redistribution layers;
wherein a pitch between the internal connection terminals of the upper semiconductor package is smaller than a pitch between the via pads of the lower semiconductor package.

11. The stack type semiconductor package of claim 10, wherein the lower semiconductor package further comprises external connection terminals which are arrayed on a lower surface of the circuit board.

12. The stack type semiconductor package of claim 11, wherein the semiconductor chip is flip-chip mounted on the circuit board and is electrically connected to the circuit board through chip connection terminals, and a back surface of the semiconductor chip is not covered by the encapsulation layer.

13. The stack type semiconductor package of claim 12, wherein the redistribution layers extend onto the back surface of the semiconductor chip and the encapsulation layer, and are electrically connected to the internal connection terminals 14. The stack type semiconductor package of claim 13, wherein the redistribution layers comprise a lead frame.

15. The stack type semiconductor package of claim 12, wherein the semiconductor chip comprises chip-through electrodes which are electrically connected to the chip connection terminals.

16. The stack type semiconductor package of claim 15, wherein the circuit board comprises board-through electrodes which are electrically connected to the chip connection terminals.

17. The stack type semiconductor package of claim 10, wherein the lower semiconductor package further comprises conductive wires which electrically connect the semiconductor chip to the circuit board, and the semiconductor chip, the via-pads, and the conductive wires are encapsulated by the encapsulation layer.

18. A stack type semiconductor package comprising;
a lower semiconductor package comprising:
a circuit board which includes board-through electrodes,
a semiconductor chip which includes chip-through electrodes and is flip-chip mounted on an upper surface of the circuit board, wherein a back surface of the semiconductor chip is exposed to the outside, and the chip-through electrodes are electrically connected to the circuit board through the board-through electrodes, via-pads which are arrayed on the upper surface of the circuit board around the semiconductor chip, and an encapsulant layer which protects the semiconductor chip and has via holes therethrough which expose the via-pads; and an upper semiconductor package stacked on the lower semiconductor package, the upper semiconductor package comprising;

internal connection terminals formed on a lower surface of the upper semiconductor package and electrically connected to the lower semiconductor package.

19. The stack type semiconductor package of claim 18, wherein the internal connection terminals of the upper semiconductor package are electrically connected to the chip-through electrodes and the board-through electrodes.

20. The stack type semiconductor package of claim 18, further comprising redistribution layers which are connected to the via-pads through the via-holes and are electrically connected to the internal connection terminals on the back surface of the semiconductor chip and the encapsulation layer, wherein the redistribution layers are electrically connected to the chip-through electrodes and the board-through electrodes.

* * * * *